United States Patent
Wang

(10) Patent No.: US 11,482,273 B1
(45) Date of Patent: Oct. 25, 2022

(54) STROBE TREE CIRCUIT FOR CAPTURING DATA USING A MEMORY-SOURCED STROBE

(71) Applicant: XILINX, INC., San Jose, CA (US)

(72) Inventor: Xiaobao Wang, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 13 days.

(21) Appl. No.: 17/095,592

(22) Filed: Nov. 11, 2020

(51) Int. Cl.
| | |
|---|---|
| G11C 7/10 | (2006.01) |
| G11C 7/20 | (2006.01) |
| G11C 7/00 | (2006.01) |
| G11C 7/22 | (2006.01) |
| G11C 7/04 | (2006.01) |
| G06F 1/04 | (2006.01) |
| G11C 11/4076 | (2006.01) |

(52) U.S. Cl.
CPC .......... *G11C 11/4076* (2013.01); *G11C 7/222* (2013.01); *G11C 7/1093* (2013.01); *G11C 2207/2254* (2013.01)

(58) Field of Classification Search
CPC ............ G11C 7/222; G11C 2207/2254; G11C 7/1093; G11C 7/22; G11C 11/4076
USPC .......... 365/193; 375/355; 711/E12.078, 105; 713/400
See application file for complete search history.

(56) References Cited

U.S. PATENT DOCUMENTS

| | | | |
|---|---|---|---|
| 7,529,141 B2 | 5/2009 | Ware et al. | |
| 9,536,589 B2 | 1/2017 | Zerbe et al. | |
| 10,573,360 B1* | 2/2020 | Ferreira | G06F 13/1689 |
| 2006/0245473 A1* | 11/2006 | Cheng | G06F 13/423 375/145 |
| 2007/0217559 A1* | 9/2007 | Stott | H04L 7/0037 375/355 |
| 2019/0130991 A1 | 5/2019 | Son et al. | |

FOREIGN PATENT DOCUMENTS

| | | | | |
|---|---|---|---|---|
| WO | WO-2009055103 A2 * | 4/2009 | ............... | G06F 1/04 |
| WO | WO-2020176448 A1 * | 9/2020 | ........... | G11C 29/023 |

* cited by examiner

*Primary Examiner* — Ly D Pham
(74) *Attorney, Agent, or Firm* — Patterson + Sheridan, LLP

(57) ABSTRACT

Examples herein relate to devices that include a strobe tree circuit for capturing data using a memory-sourced strobe. In an example, a device includes a data capture path including first and second flip-flops, and a strobe tree including a comparator and first and second multiplexers. The comparator is configured to output complementary signals on first and second output nodes. First and second selection input nodes of the first multiplexer are connected to the first and second output nodes of the comparator, respectively. First and second selection input nodes of the second multiplexer are connected to the second and first output nodes of the comparator, respectively. The read strobe tree is configured to provide first and second signals output from the first and second multiplexers to first and second nodes, respectively. Clock input nodes of the first and second flip-flops are connected to the first and second nodes, respectively.

15 Claims, 4 Drawing Sheets

STROBE TREE CIRCUIT FOR CAPTURING DATA USING A MEMORY-SOURCED STROBE

TECHNICAL FIELD

This disclosure relates to an electronic device comprising a strobe tree circuit for capturing data using a memory-sourced strobe.

BACKGROUND

Electronic devices (e.g., computers, laptops, tablets, copiers, digital cameras, smart phones, and the like) often employ integrated circuits (ICs). These integrated circuits are typically implemented as IC chips packaged in packages of electronic devices. The IC chips may include processors, programmable logic circuits, application specific ICs, memory, and/or any of various other suitable circuit types.

Memory is commonly incorporated into various electronic devices. ICs within the electronic devices can communicate with the memory. A number of technologies have been created for different types of memory. High bandwidth memory (HBM) is one such technology. HBM is an interface for random access memory (RAM) that is defined by a specification adopted by the JEDEC. HBM provides for low latency, high bandwidth access to memory by an IC.

SUMMARY

Some examples described herein relate to electronic devices that include a strobe tree circuit for capturing data using a memory-sourced strobe. A circuit (e.g., an integrated circuit) can include multiplexers that permit swapping complementary read strobe signals to move rising edges of the complementary read strobe signals by one unit interval (UI). This can facilitate centering rising edges of the read strobe signals to centers of data eyes using a low performance, power, and area (PPA) cost solution.

In an example, an electronic device includes a data capture path and a read strobe tree. The data capture path includes a first flip-flop and a second flip-flop. The read strobe tree includes a first comparator, a first multiplexer, and a second multiplexer. The first comparator has a first output node and a second output node, and is configured to output complementary signals on the first output node and the second output node of the first comparator. A first selection input node of the first multiplexer is electrically connected to the first output node of the first comparator, and a second selection input node of the first multiplexer is electrically connected to the second output node of the first comparator. A first selection input node of the second multiplexer is electrically connected to the second output node of the first comparator, and a second selection input node of the second multiplexer is electrically connected to the first output node of the first comparator. The read strobe tree is configured to provide a first signal output from an output node of the first multiplexer to a first node and to provide a second signal output from an output node of the second multiplexer to a second node. A clock input node of the first flip-flop is electrically connected to the first node, and a clock input node of the second flip-flop is electrically connected to the second node.

An example is a method for operating an electronic device. Data is captured, by a data capture path, based on a first signal on a first node and a second signal on a second node. The first signal is output from an output node of a first multiplexer, and the second signal is output from an output node of a second multiplexer. A first selection input node of the first multiplexer is electrically connected to a first output node of a first comparator, and a second selection input node of the first multiplexer is electrically connected to a second output node of the first comparator. A first selection input node of the second multiplexer is electrically connected to the second output node of the first comparator, and a second selection input node of the second multiplexer is electrically connected to the first output node of the first comparator. The first comparator is configured to output complementary signals on the first output node and the second output node of the first comparator.

In an example, an electronic device includes first and second comparators, first and second flip-flops, first and second multiplexers, and first and second signal paths. The first comparator has an output node. The first flip-flop has a data input node electrically coupled to the output node of the first comparator, and the second flip-flop has a data input node electrically coupled to the output node of the first comparator. The second comparator has a first output node and a second output node, and the second comparator is configured to output complementary signals on the first output node and the second output node of the second comparator. The first multiplexer has a first selection input node, a second selection input node, and an output node. The first selection input node of the first multiplexer is electrically connected to the first output node of the second comparator, and the second selection input node of the first multiplexer is electrically connected to the second output node of the second comparator. The second multiplexer has a first selection input node, a second selection input node, and an output node. The first selection input node of the second multiplexer is electrically connected to the second output node of the second comparator, and the second selection input node of the second multiplexer is electrically connected to the first output node of the second comparator. The first signal path is electrically connected between the output node of the first multiplexer and a first node. A clock input node of the first flip-flop is electrically connected to the first node. The second signal path is electrically connected between the output node of the second multiplexer and a second node. A clock input node of the second flip-flop is electrically connected to the second node.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
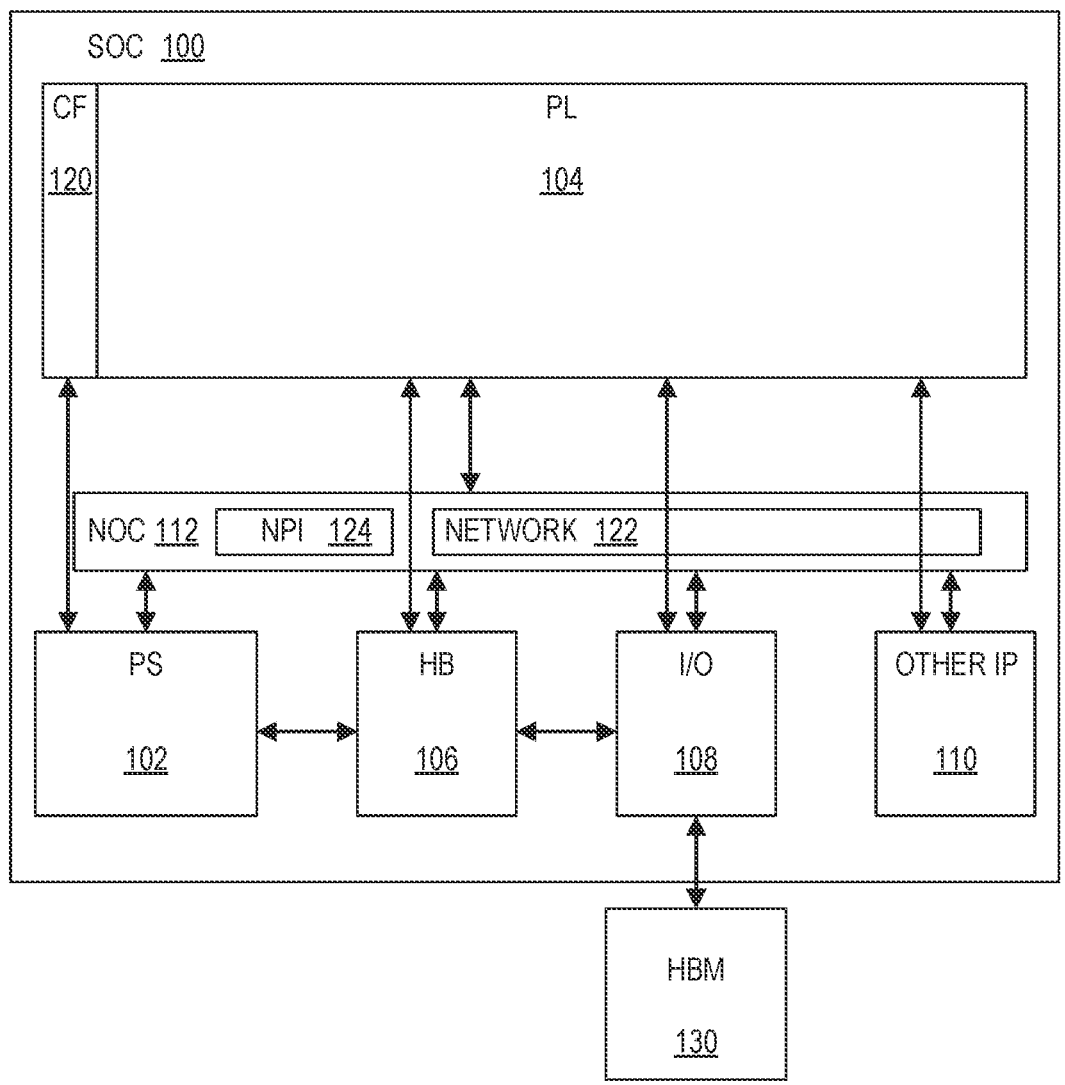
FIG. 1 depicts an architecture for an electronic device according to some examples.

Some examples described herein relate to electronic devices that include a strobe tree circuit for capturing data using a memory-sourced strobe. Generally, in some memory technologies, when memory is implemented in a chip separate from the chip that includes a memory controller for reading from the memory, the memory transmits a differential strobe signal to a memory controller, and the memory controller generates complementary read strobe signals based on the differential strobe signal. The complementary read strobe signals can enable reading data from the memory at a double data rate (DDR). DDR dynamic random access memory (DDR-DRAM) has been implemented in various technologies. High Bandwidth Memory (HBM) is a memory technology that implements DDR-DRAM and is defined by a JEDEC specification. Examples described herein provide for an electronic device that includes a circuit (e.g., an integrated circuit) that includes multiplexers that permit swapping the complementary read strobe signals to move rising edges of the complementary read strobe signals by one unit interval (UI). This can facilitate centering rising edges of the read strobe signals to centers of data eyes using a low performance, power, and area (PPA) cost solution. Although examples described herein are described with respect to HBM technology, aspects can be implemented with any technology that sources a strobe signal from memory, such as any DDR memory technology that sources a strobe signal from the memory.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed subject matter or as a limitation on the scope of the claimed subject matter. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

In the description that follows, various signals or data are described in the context of the operation of various circuits. A described signal or data indicates a corresponding node on which the signal or data is applied or propagated and further indicates nodes that are communicatively coupled and/or electrically connected. For example, description of a signal or data output from a first circuit and input to a second circuit indicates an output node of the first circuit (on which the signal or data is output from the first circuit) is communicatively coupled and/or electrically connected to an input node of the second circuit (on which the signal or data is input to the second circuit). Explicit description of such nodes may be omitted in the following description, but a person having ordinary skill in the art will readily understand the presence of the nodes.

FIG. 1 illustrates an architecture for an electronic device according to some examples. In some examples, the electronic device can be a programmable device, while in other examples, the electronic device may not be programmable. In the illustrated example, the electronic device is a programmable device, and further includes a System-on-Chip (SoC) 100, which is an integrated circuit (IC) implemented on a chip. The SoC 100 includes a plurality of subsystems, including a processing system (PS) 102, programmable logic region (PL) 104, hard block circuits (HB) 106, input/output circuits (I/O) 108, other IP circuits 110 (e.g., a system monitor or others), and a Network-on-Chip (NoC) 112. In some examples, each sub-system includes at least some component or circuit that is programmable. In some examples, some of the sub-systems can include a non-programmable application-specific circuit.

The PS 102 may be or include any of a variety of different processor types and number of processor cores. For example, the PS 102 may be implemented as an individual processor, e.g., a single core capable of executing program instruction code. In another example, the PS 102 may be implemented as a multi-core processor. The PS 102 may be implemented using any of a variety of different types of architectures. Example architectures that may be used to implement the PS 102 may include an ARM processor architecture, an x86 processor architecture, a graphics processing unit (GPU) architecture, a mobile processor architecture, a digital signal processor (DSP) architecture, or other suitable architecture that is capable of executing computer-readable program instruction code.

The PL 104 is logic circuitry that may be programmed or configured to perform specified functions. As an example, the PL 104 may be implemented as fabric of a field programmable gate array (FPGA). The PL 104 can include programmable logic elements including configurable logic blocks (CLBs), look-up tables (LUTs), random access memory blocks (BRAM), Ultra RAMs (URAMs), input/output blocks (IOBs), digital signal processing blocks (DSPs), clock managers, and/or delay lock loops (DLLs). In some architectures, the PL 104 includes columns of programmable logic elements, where each column includes a single type of programmable logic element (e.g., a column of CLBs, a column of BRAMs, etc.). The programmable logic elements can have one or more associated programmable interconnect elements. For example, in some architectures, the PL 104 includes a column of programmable interconnect elements associated with and neighboring each column of programmable logic elements. In such examples, each programmable interconnect element is connected to an associated programmable logic element in a neighboring column and is connected to neighboring programmable interconnect elements within the same column and the neighboring columns. The interconnected programmable interconnect elements can form a global interconnect network within the PL 104.

The PL 104 has an associated configuration frame interconnect (CF) 120. A configuration frame node residing on a controller (e.g., a platform management controller (PMC)) of the PS 102 is connected to the CF 120. The controller of the PS 102 sends configuration data to the configuration frame node, and the configuration frame node formats the configuration data in frames and transmits the frames through the CF 120 to the programmable logic elements and programmable interconnect elements. The configuration data may then be loaded into internal configuration memory cells of the programmable logic elements and programmable interconnect elements that define how the programmable elements are configured and operate. Any number of different sections or regions of PL 104 may be implemented in the SoC 100.

The HB 106 can be or include memory controllers (such as double data rate (DDR) memory controllers (e.g., for fourth generation DDR (DDR4), fifth generation DDR (DDR5), etc.), high bandwidth memory (HBM) memory controllers (e.g., for updated second generation of HBM (HBM2e), third generation of HBM (HBM3), etc.), or the like), peripheral component interconnect express (PCIe) blocks, Ethernet cores (such as a 100 Gbps (C=100) media address controller (CMAC), a multi-rate MAC (MRMAC), or the like), forward error correction (FEC) blocks, Analog-to-Digital Converters (ADC), Digital-to-Analog Converters (DAC), and/or any other hardened circuit. The I/O 108 can be implemented as High Performance Input/Output (HPIO), eXtreme DDR5 compatible Input/Output (X510), eXtreme Performance Input/Output (XPIO), High Density Input/Output (HDIO), Ultra-Dense Input/Output (UDIO), HBM input/output, multi-gigabit transceivers (MGTs), or any other input/output blocks. Any of the HB 106 and/or I/O 108 can be programmable.

The NoC 112 includes a programmable network 122 and a NoC peripheral interconnect (NPI) 124. The programmable network 122 communicatively couples subsystems and any other circuits of the SoC 100 together. The programmable network 122 includes NoC packet switches and interconnect lines connecting the NoC packet switches. Each NoC packet switch performs switching of NoC packets in the programmable network 122. The programmable network 122 has interface circuits at the edges of the programmable network 122. The interface circuits include NoC master units (NMUs) and NoC slave units (NSUs). Each NMU is an ingress circuit that connects a master circuit to the programmable network 122, and each NSU is an egress circuit that connects the programmable network 122 to a slave endpoint circuit. NMUs are communicatively coupled to NSUs via the NoC packet switches and interconnect lines of the programmable network 122. The NoC packet switches are connected to each other and to the NMUs and NSUs through the interconnect lines to implement a plurality of physical channels in the programmable network 122. The NoC packet switches, NMUs, and NSUs include register blocks that determine the operation of the respective NoC packet switch, NMU, or NSU.

A physical channel can also have one or more virtual channels. The virtual channels can implement weights to prioritize various communications along any physical channel. The NoC packet switches also support multiple virtual channels per physical channel. The programmable network 122 includes end-to-end Quality-of-Service (QoS) features for controlling data-flows therein. In examples, the programmable network 122 first separates data-flows into designated traffic classes. Data-flows in the same traffic class can either share or have independent virtual or physical transmission paths. The QoS scheme applies multiple levels of priority across traffic classes. Within and across traffic classes, the programmable network 122 applies a weighted arbitration scheme to shape the traffic flows and provide bandwidth and latency that meets the user requirements.

The NPI 124 includes circuitry to write to register blocks that determine the functionality of the NMUs, NSUs, and NoC packet switches. The NPI 124 includes a peripheral interconnect coupled to the register blocks for programming thereof to set functionality. The register blocks in the NMUs, NSUs, and NoC packet switches of the programmable network 122 support interrupts, QoS, error handling and reporting, transaction control, power management, and address mapping control. The NPI 124 includes an NPI root node residing on the controller of the PS 102, interconnected NPI switches connected to the NPI root node, and protocol blocks connected to the interconnected NPI switches and a corresponding register block.

To write to register blocks, the controller of the PS 102 sends configuration data to the NPI root node, and the NPI root node packetizes the configuration data into a memory mapped write request in a format implemented by the NPI 124. The NPI transmits the memory mapped write request to interconnected NPI switches, which route the request to a protocol block connected to the register block to which the request is directed. The protocol block can then translate the memory mapped write request into a format implemented by the register block and transmit the translated request to the register block for writing the configuration data to the register block.

The NPI 124 may be used to program any programmable boundary circuit of the SoC 100. For example, the NPI 124 may be used to program any HB 106 and/or I/O 108 that is programmable.

Various subsystems and circuits of the SoC 100 are communicatively coupled by various communication mechanisms. Some subsystems or circuits can be directly connected to others. As illustrated, the I/O 108 is directly connected to the HB 106 and PL 104, and the HB 106 is further directly connected to the PL 104 and the PS 102. The other IP circuits 110 can also be directly connected to the PL 104, as illustrated. The PS 102, PL 104, HB 106, I/O 108, and other IP circuits 110 are communicatively coupled together via the programmable network 122 of the NoC 112.

In some examples, the SoC 100 can be communicatively coupled to other components. As illustrated, the SoC 100 is communicatively coupled to HBM 130. The HBM 130 can be one or more chip stacks, each including multiple memory chips. The one or more chip stacks can be included in a same package as the SoC 100, such as connected to a same substrate, like a same semiconductor-based (e.g., silicon) interposer. The HBM 130 is communicatively coupled to the I/O 108 (e.g., via the substrate), which is connected to HB 106 (e.g., one or more memory controllers), the programmable network 122 of the NoC 112, and the PL 104. The HB 106 is connected to the PS 102 (e.g., the controller of the PS 102). Other memory can be communicatively connected to other I/O 108 and/or HB 106, such as dynamic random access memory (DRAM), flash memory, or the like.

Generally, the HB 106 and/or I/O 108 are configured to implement communications with the HBM 130. As examples, a HBM memory controller and I/O can generally be implemented according to the HBM2e specification, the HBM3 specification, or the like. (It is noted that presently the HBM3 specification has not been ratified as final, and that any subsequent revisions to the specification can alter examples described herein.) In other examples, other memory and/or memory technologies can be implemented instead of or in addition to HBM.

The electronic device illustrated in FIG. 1 can be or can include a circuit like the SoC 100 implemented in a single monolithic IC chip, or implemented distributed across multiple IC chips. In some implementations, the electronic device includes one programmable IC chip and a HBM chip stack, where the programmable IC chip and a bottom IC chip of the HBM chip stack are attached to a substrate, such as an interposer. In some implementations, the electronic device includes multiple programmable IC chips and a HBM chip stack. In these implementations, the programmable IC chips and a bottom IC chip of the HBM chip stack are attached to a substrate. In such implementations, various subsystems of the SoC 100 can be implemented on different ones of the programmable IC chips.

In some implementations, the electronic device includes a chip stack (e.g., an Active-on-Active (AoA) chip stack) including multiple programmable IC chips and a HBM chip stack. The respective bottom IC chip of the AoA chip stack and HBM chip stack are attached to a substrate. In such implementations, various subsystems of the SoC 100 can be implemented on different ones of the programmable IC chips of the AoA chip stack. The programmable IC chips can be stacked on each other, where neighboring chips are bonded (e.g., by hybrid oxide-to-oxide and metal-to-metal bonding) to each other or are attached to each other by external connectors (e.g., minibumps or microbumps).

Figure 2:
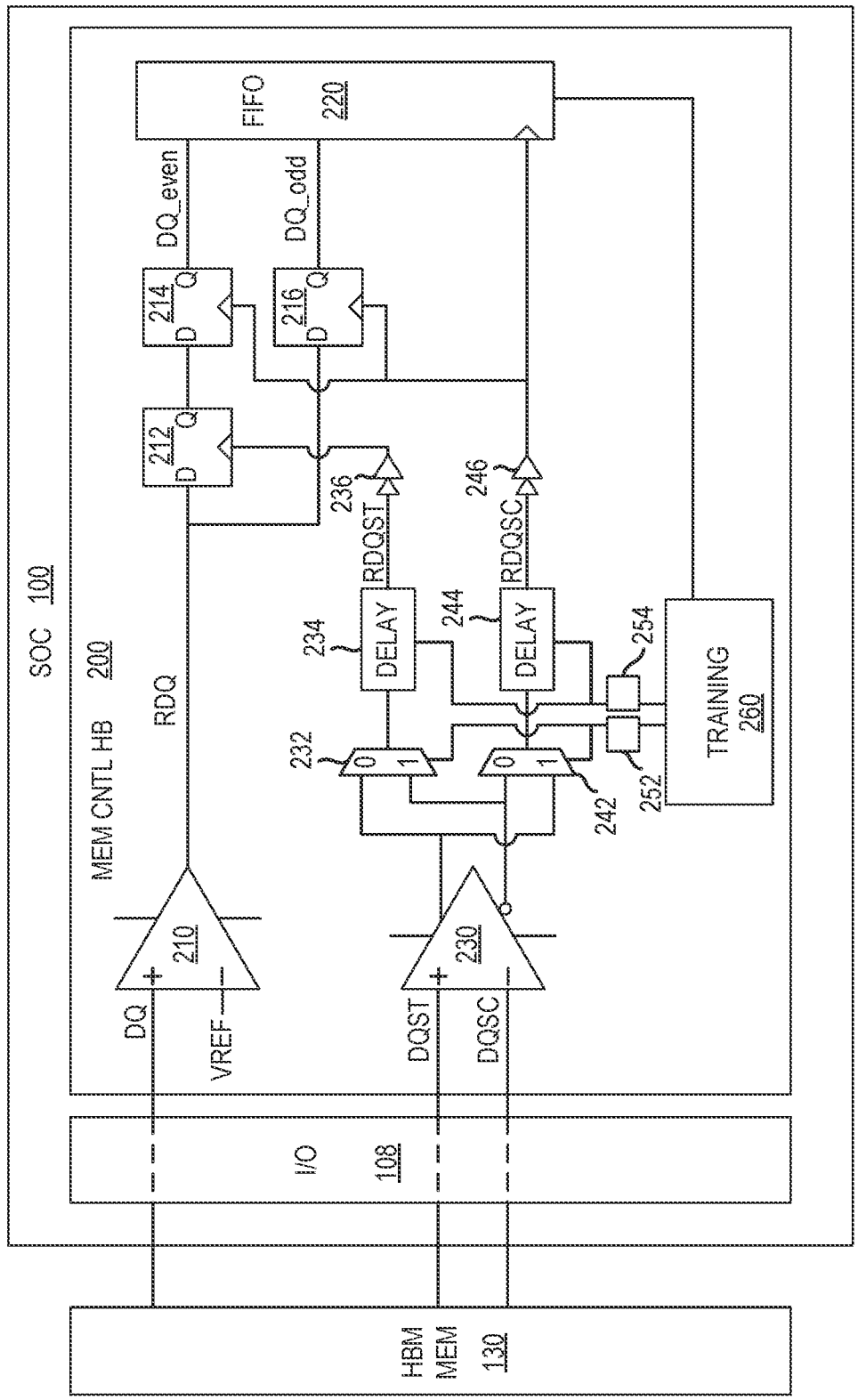
FIG. 2 is a circuit schematic of a memory controller hardblock in the SoC of FIG. 1 according to some examples.

FIG. 2 is a circuit schematic of a memory controller hardblock (MCHB) 200 in the SoC 100 according to some examples. The MCHB 200 can be a HB 106 in the SoC 100 of FIG. 1. The MCHB 200 includes a data capture path and a read strobe distribution tree. One data capture path is illustrated in FIG. 2, although in practice, the MCHB 200 includes multiple data capture paths, e.g., according to the appropriate generation of the HBM specification. For example, with the HBM2e specification, forty-four data capture paths can be implemented per read strobe distribution tree, and one channel can include four read strobe distribution trees and corresponding data capture paths. Further, the MCHB 200 can include eight channels according to the HBM2e specification.

The data capture path includes a comparator 210 (e.g., a single-ended output comparator) and flip-flops 212, 214, 216 (e.g., D flip-flops). A first input node of the comparator 210 (e.g., a positive input node) is configured to receive a data signal (DQ) from the HBM 130 via the I/O 108. The first input node of the comparator 210 is communicatively coupled to a data output node of the HBM 130 through the I/O 108. A second input node of the comparator 210 (e.g., a negative input node) is configured to receive a reference voltage (VREF). The second input node of the comparator 210 is electrically connected to a VREF node. The comparator 210 has an output node that is electrically connected to respective data input nodes (D) of the flip-flops 212, 216. The comparator 210 is configured to compare the data signal (DQ) to the reference voltage (VREF) and output, as a read data signal (RDQ), a logical "1" when the data signal (DQ) is greater than the reference voltage (VREF) and a logical "0" when the data signal (DQ) is less than the reference voltage (VREF).

An output node (Q) of the flip-flop 212 is electrically connected to a data input node (D) of the flip-flop 214. Respective output nodes (Q) of the flip-flops 214, 216 are electrically connected to input nodes of a receive first in, first out (FIFO) buffer 220. The flip-flops 212, 216 are configured to capture data from the read data signal (RDQ) using different strobe signals as described further below. The flip-flops 214, 216 are configured to capture data using a same strobe signal, e.g., to synchronize data output from the flip-flops 214, 216. Data output from the flip-flop 214 is even data (DQ_even), and data output from the flip-flop 216 is odd data (DQ_odd). The receive FIFO buffer 220 is configured to store (e.g., temporarily) the data output from the flip-flops 214, 216 prior to the MCHB 200 transmitting the read data stored in the receive FIFO buffer 220 to a circuit (e.g., the PS 102, the PL 104, etc.) in the SoC 100 that requested the read.

The read strobe distribution tree includes a comparator 230 (e.g., a differential output comparator), multiplexers 232, 242, delay circuits 234, 244, and driver circuits 236, 246. A first input node of the comparator 230 (e.g., a positive input node) is configured to receive a first data strobe signal (DQST) from the HBM 130 via the I/O 108. The first input node of the comparator 230 is communicatively coupled to a first data strobe output node of the HBM 130 through the I/O 108. A second input node of the comparator 230 (e.g., a negative input node) is configured to receive a second (e.g., differential) data strobe signal (DQSC) from the HBM 130 via the I/O 108. The second input node of the comparator 230 is communicatively coupled to a second data strobe output node of the HBM 130 through the I/O 108. A first output node of the comparator 230 (e.g., a positive output node) is electrically connected to a first input node of the multiplexer 232 (e.g., a "0"-selection input node), and a second output node of the comparator 230 (e.g., a negative output node) is electrically connected to a first input node of the multiplexer 242 (e.g., a "0"-selection input node). The first output node of the comparator 230 (e.g., the positive output node) is further electrically connected to a second input node of the multiplexer 242 (e.g., a "1"-selection input node), and the second output node of the comparator 230 (e.g., the negative output node) is electrically connected to a second input node of the multiplexer 232 (e.g., a "1"-selection input node). An output node of the multiplexer 232 is electrically connected to an input node of the delay line 234, and an output node of the multiplexer 242 is electrically connected to an input node of the delay circuit 244.

An output node of the delay circuit 234 is electrically connected to an input node of the driver circuit 236, and an output node of the driver circuit 236 is a RDQST node and is electrically connected to corresponding clock input nodes of flip-flops 212 in data capture paths. An output node of the delay circuit 244 is electrically connected to an input node of the driver circuit 246, and an output node of the driver circuit 246 is a RDQSC node and is electrically connected to corresponding clock input nodes of flip-flops 214, 216 in data capture paths. As noted previously, one data capture path is illustrated in FIG. 2, although multiple data capture paths can be included, and hence, the respective RDQST and RDQSC nodes (e.g., output nodes of the driver circuits 236, 246) can be electrically connected to respective flip-flops 212, 214, 216 in those data capture paths. Additionally, the RDQSC node (e.g., the output node of the driver circuit 246) is electrically connected to a clock input node of the receive FIFO buffer 220.

The comparator 230 is configured to compare the first and second data strobe signals (DQST, DQSC), where the first and second data strobe signals (DQST, DQSC) are a differential signal, and output complementary strobe signals at the first and second output nodes of the comparator 230. The multiplexer 232 is configured to selectively output, as a true read data strobe signal (RDQST), one of the complementary strobe signals output from the comparator 230, and the multiplexer 242 is configured to selectively output, as a complementary read data strobe signal (RDQSC), the other one of the complementary strobe signals output from the comparator 230. The delay circuits 234, 244 are configured to delay and output the true read data strobe signal (RDQST)

and complementary read data strobe signal (RDQSC), respectively. Each delay circuit 234, 244 can have a tunable delay. Each delay circuit 234, 244 can be, for example, a chain of serially connected buffer circuits where output nodes of the buffer circuits (e.g., tap nodes) are electrically connected to respective input nodes of a multiplexer. The multiplexer in such examples can output a strobe signal passing through a target number of buffer circuits to delay the strobe signal. The driver circuit 236 drives the true read data strobe signal (RDQST) on the RDQST node to the clock input nodes of flip-flops 212 on the data capture paths, and the driver circuit 246 drives the complementary read data strobe signal (RDQSC) on the RDQSC node to the clock input nodes of flip-flops 214, 216 on the data capture paths and the clock input node of the receive FIFO buffer 220.

Since the read data strobe signals (RDQST, RDQSC) are complementary, data can be captured by the flip-flop 212 from the read data signal (RDQ) on a rising edge of the true read data strobe signal (RDQST), while data can be captured by the flip-flop 216 from the read data signal (RDQ) on a rising edge of the complementary read data strobe signal (RDQSC), which corresponds to a falling edge of the true read data strobe signal (RDQST). The flip-flop 214 can capture data on a rising edge of the complementary read data strobe signal (RDQSC) to synchronize data (DQ_even, DQ_odd) output to the receive FIFO buffer 220.

The MCHB 200 includes memory 252, 254. The memory 252 is communicatively coupled to control input nodes of the multiplexers 232, 242. The memory 252 can be a one-bit memory element, such as static random access memory (SRAM), a flip-flop, or the like. The multiplexers 232, 242 are configured to output, on a respective output node, a signal that is input on a selected input node of the respective multiplexer 232, 242 based on the control data stored in the memory 252. In the illustrated example, based on the control data stored in the memory 252, the multiplexers 232, 242 are configured to pass the complementary signals output from the comparator selectively on the RDQST path (e.g., including the delay circuits 234 and driver circuit 236) and the RDQSC path (e.g., including the delay circuits 244 and driver circuit 246). In the illustrated example, when the memory 252 is written with a logical "0", the multiplexer 232 outputs the signal output from the first output node of the comparator 230 (e.g., the positive output node) to the RDQST path, and the multiplexer 242 outputs the signal output from the second output node of the comparator 230 (e.g., the negative output node) to the RDQSC path. When the memory 252 is written with a logical "1", the multiplexer 232 outputs the signal output from the second output node of the comparator 230 (e.g., the negative output node) to the RDQST path, and the multiplexer 242 outputs the signal output from the first output node of the comparator 230 (e.g., the positive output node) to the RDQSC path. Hence, by writing control data to the memory 252, the multiplexers 232, 242 can be configured to swap the complementary signals output to the RDQST and RDQSC paths.

The memory 254 is communicatively coupled to control input nodes of the delay circuits 234, 244. The memory 254 can be a memory element, such as SRAM, flip-flop, or the like, having any bit length. A bit length of the memory 254 can be determined based on the configuration of the delay circuits 234, 244, such as depending on a number of bits to select an amount of delay to be implemented along the respective RDQST and RDQSC paths. If the delay circuits 234, 244 are each serially connected buffer circuits with output nodes (e.g., tap nodes) electrically connected to input nodes of a multiplexer, the memory 254 can be communicatively coupled to a control input node of the multiplexer such that the control data stored in the memory 254 can identify a selected input node of the multiplexer, and the multiplexer can be controlled by that control data to output a signal (with the delay implemented at the corresponding tap node) on that selected input node. The number of bits of the memory 254 in that instance can depend on the number of taps and input nodes of the multiplexer. Variations can be implemented in other examples.

The illustrated example is capable of implementing a dynamic training to set control data for the multiplexers 232, 242 and the delay circuits 234, 244. The MCHB 200 includes a training circuit 260. During an initialization, the training circuit 260 writes some arbitrary control data to the memory 252, 254. For example, initially, the control data written to the memory 252 can be a logical "0" and can cause the multiplexers 232, 242 to output the strobe signal output from the first output node (e.g., the positive output node) and the strobe signal output from the second output node (e.g., the negative output node) as the true read data strobe signal (RDQST) and complementary read data strobe signal (RDQSC), respectively. Further, the control data written to the memory 254 can be a logical "0" and can cause the delay circuits 234, 244 to implement a smallest amount of delay. The MCHB 200, during training, captures data from the HBM 130 while the HBM 130 transmits known data. The training circuit 260 includes a checker circuit that compares the captured data (received from the receive FIFO buffer 220) to the known data.

The training circuit 260 includes a state machine that responsively adds delay to the read data strobe signals (RDQST, RDQSC). As stated above, the state machine initially sets the control data in memory 252 to a logical "0" and iteratively increases the control data in the memory 254 to incrementally increase the delay implemented by the delay circuits 234, 244 until the comparison of the captured data to the known data indicates that a right side edge of a valid data eye has been identified (e.g., based on an error rate of the comparison). The control data written to the memory 254 that corresponds to the right side edge of a valid data eye when the memory 252 stores a logical "0" is referred to herein as "$A_{Tap}$" for ease. Once the $A_{Tap}$ is identified, the state machine writes a logical "1" as the control data stored in the memory 252. This change to the control data in the memory 252 effectively causes the multiplexers 232, 242 to add one unit interval (UI) of delay to the read data strobe signals (RDQST, RDQSC). With the control data stored in memory 252 set to a logical "1", the state machine resets the control data in memory 254 to a logical "0" and iteratively increases the control data in the memory 254 to incrementally increase the delay implemented by the delay circuits 234, 244 until the comparison of the captured data to the known data indicates that both a left side edge and a right side edge of a valid data eye has been identified (e.g., based on an error rate of the comparison). The control data written to the memory 254 that corresponds to the left side edge of a valid data eye when the memory 252 stores a logical "1" is referred to herein as "$B_{Tap}$" for ease, and the control data written to the memory 254 that corresponds to the right side edge of a valid data eye when the memory 252 stores a logical "1" is referred to herein as "$C_{Tap}$" for ease. The control data to be written to the memory 254, referred to as "$D_{Tap}$" for ease, is then determined based on Taps $A_{Tap}$, $B_{Tap}$, and $C_{Tap}$. If $A_{Tap}$ is greater than or equal to $(C_{Tap}-B_{Tap})/2$, $D_{Tap}=A_{Tap}-(C_{Tap}-B_{Tap})/2$. In this situation, the control data of the memory 252 is written to be a logical "0", and the control data of the memory 254 is written to be $D_{Tap}$. Otherwise, if $A_{Tap}$ is not greater than or equal to $(C_{Tap}-B_{Tap})/2$, $D_{Tap}=C_{Tap}-(C_{Tap}-B_{Tap})/2$. In this situation, the control data of the memory 252 is written to be a logical "1", and the control data of the memory 254 is written to be $D_{Tap}$. Thus, the state machine is configured to select a delay to center the rising edges of the read data strobe signals (RDQST, RDQSC) in the data eye.

In other examples, the MCHB 200 can implement static control of the delay of the read data strobe signals (RDQST, RDQSC). In such examples, the MCHB 200 can omit the training circuit 260. Control data can be written to the memory 252, 254, which remains static through the operation of the MCHB 200 until re-written. The control data written to the configuration memory can be determined based on the usage of the MCHB 200 to read data, such as a data rate. With a known data rate, the appropriate delay can be determined such that the rising edges of the read data strobe signals (RDQST, RDQSC) are set to a center of a data eye. The control data can be determined based on user design of the electronic device.

Figure 3:
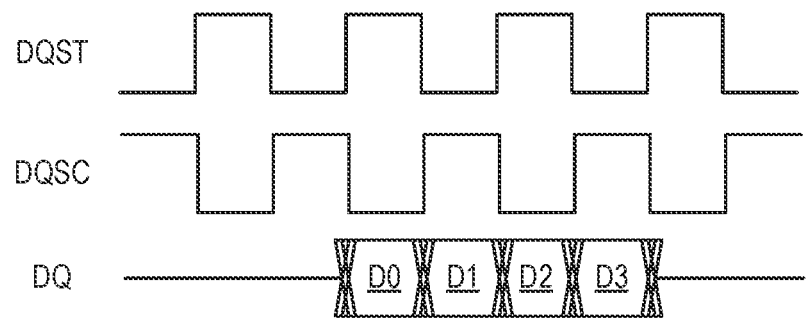
FIG. 3 is a timing diagram of signals received at the memory controller hardblock of FIG. 2 according to some examples.

FIG. 3 is a timing diagram of the data signal (DQ) and the first and second data strobe signals (DQST, DQSC) received at the MCHB 200 according to some examples. The signals (DQ, DQST, DQSC) are received phase aligned at the MCHB 200 (e.g., at the comparators 210, 230). Generally, based on HBM2e JEDEC specification, a burst length of a read burst is 2 or 4 for a respective read command. In the illustrated example, the read burst is 4 and has data bits D0, D1, D2, D3. For other technologies and/or implementations, different burst lengths may be used. The data signal (DQ) may have a pre-amble before the data read burst and may have a post-amble following the data read burst.

Figure 4:
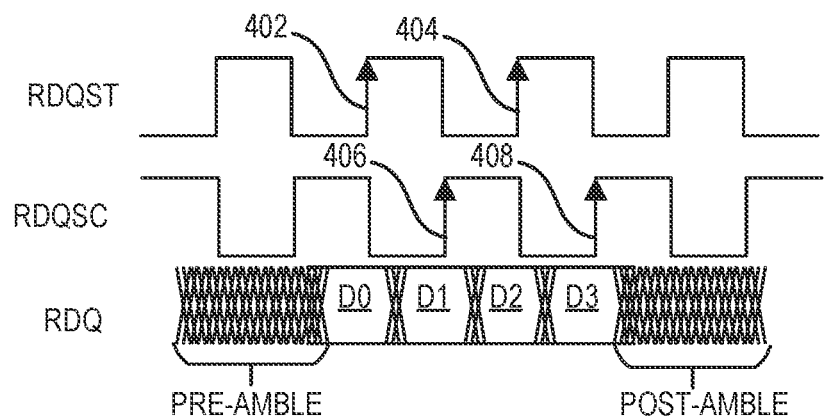
FIG. 4 is a timing diagram of signals without timing elements described with respect to FIG. 2.

FIG. 4 is a timing diagram of a read data signal (RDQ) and true and complementary read data strobe signals (RDQST, RDQSC), e.g., without timing elements described with respect to FIG. 2. Particularly, the multiplexers 232, 242 and delay circuits 234, 244 are not implemented with respect to the signals of FIG. 4. Assume that the true read data strobe signal (RDQST) is the signal output from the first output node (e.g., positive output node) of the comparator 230, and that the complementary read data strobe signal (RDQSC) is the signal output from the second output node (e.g., negative output node) of the comparator 230. Generally, due to extra insertion delays in the RDQST and RDQSC paths for the true and complementary read data strobe signals (RDQST, RDQSC), the relative timing between the true and complementary read data strobe signals (RDQST, RDQSC) and the read data signal (RDQ) at the capture flop inputs can be as generally shown in FIG. 4.

When the signals of FIG. 4 are received at the respective flip-flops, identifying the left side edge of the data eye of data D0 using the first real rising edge 402 of the true read data strobe signal (RDQST) may not be feasible. Additionally, the rising edges 402, 404, 406, 408 of the true and complementary read data strobe signals (RDQST, RDQSC), as illustrated, have passed the centers of the respective data eyes of the read data signal (RDQ), so placing the true and complementary read data strobe signals (RDQST, RDQSC) in the center of data eyes may be impractical. Note that the pre-amble and post-amble cycles of the true and complementary read data strobe signals (RDQST, RDQSC) are either filtered, or the data captured by pre-amble and post-amble edges from the read data signal (RDQ) may be discarded.

Figure 5:
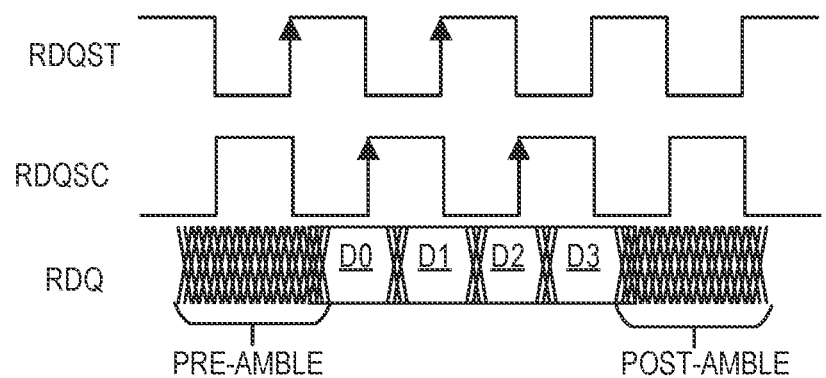
FIG. 5 is a timing diagram of signals according to some examples.

FIG. 5 is a timing diagram of a read data signal (RDQ) and true and complementary read data strobe signals (RDQST, RDQSC) according to some examples. Relative to the timing diagram of FIG. 4, the true and complementary read data strobe signals (RDQST, RDQSC) are swapped in FIG. 5 by, e.g., writing a logical "1" to the memory 252, which sets the control signal input to the multiplexers 232, 242 to a logical "1".

The swapping of the true and complementary read data strobe signals (RDQST, RDQSC) results in strobe edges being moved left by one unit interval (UI) (e.g., a half cycle of the true and complementary read data strobe signals (RDQST, RDQSC)). By moving the strobe edges to the left by one UI, strobe edges can arrive at the capture flip-flops 212, 216 before the data. Accordingly, since the strobe edges can arrive before the data, the left side edge of a data eye of the read data signal (RDQ) can be identified using the first strobe edge of the true read data strobe signal (RDQST), and the edges of the true and complementary read data strobe signals (RDQST, RDQSC) can be placed at the center of data eyes of the read data signal (RDQ), e.g., with further use of the delay circuits 234, 244. Regardless of the settings of the control signals input to the multiplexers 232, 242, rising edges of the complementary read data strobe signal (RDQSC) are used to capture and align the DQ_even and DQ_odd data and to trigger the receive FIFO buffer 220.

According to the examples described herein, particularly FIG. 2, a cost of inserting the multiplexers 232, 242 and delay circuits 234, 244 can be low. As described, two multiplexers are inserted in the read strobe distribution tree, as opposed to, e.g., delay circuits being inserted in each data capture path. If delay circuits are inserted in each data capture path (e.g., between a corresponding comparator 210 and capture flip-flops 212, 216), in some implementations, forty-four different delay circuits would be inserted per instance of a read strobe distribution tree. Such insertion in the data capture paths would have a high power, performance, and area (PPA) cost. However, according to some examples herein, no delay circuit is inserted in a data capture path. In some examples, an output node of the comparator 210 is electrically connected (e.g., directly electrically connected) to data input nodes (D) of the flip-flops 212, 216. Accordingly, some examples can have a very low PPA cost since fewer components (e.g., the multiplexers 232, 242) are inserted in the circuit.

Examples described herein generally operate on the assumption that one UI is more than the insertion delay of the multiplexers 232, 242, delay circuits 234, 244, and any other element of the read strobe distribution tree. Simulation results showed that this insertion delay was less than 200 ps over all process, voltage, and temperature (PVT) corners in implementations fabricated at a 7 nm process node. Hence, this assumption remains true for, e.g., 1 UI=312 ps @ 3.2 Gb/s. Different insertion delays can permit different speeds.

In some examples, DQS gating logic is not implemented to filter out the pre-amble and post-amble of strobes. In such examples, the data captured by the pre-amble and post-amble edges can be discarded in the receive FIFO buffer 220. In some examples, DQS gating logic can be implemented in the RDQSC path.

Figure 6:
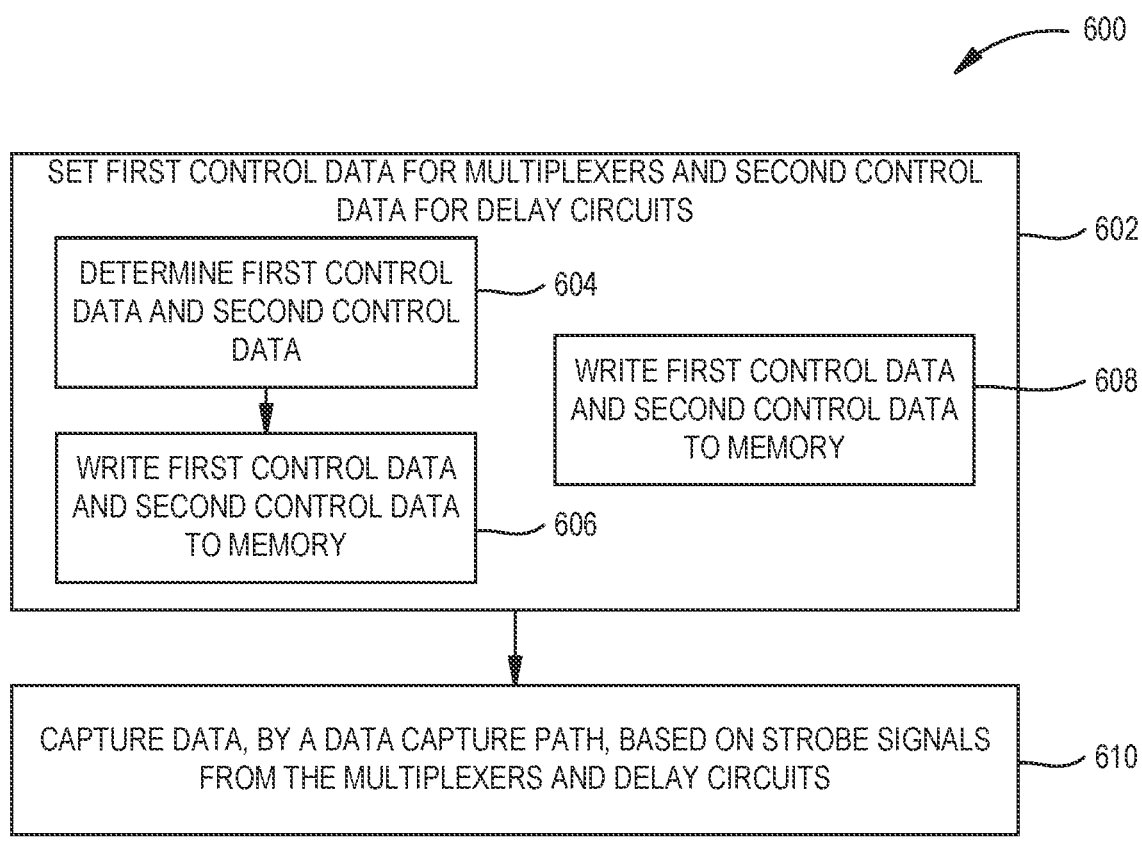
FIG. 6 is a flowchart of a method of operating an electronic device that includes memory according to some examples.

FIG. 6 is a flowchart of a method 600 of operating an electronic device that includes memory according to some examples. The electronic device can have the architecture and circuits described above with respect to FIGS. 1 and 2. The method 600 is described in the context of FIG. 2 with HBM, although other circuits and other memory can be implemented.

At block 602, first control data for multiplexers and second control data for delay circuits are set. Block 602 can be dynamic or static. Blocks 604, 606 illustrate a dynamic implementation, and block 608 illustrates a static implementation.

In dynamic examples, at block 604, the first and second control data are determined. Initially, the training circuit 260 writes first and second control data to the memory 252, 254 to set the multiplexers 232, 242 and delay circuits 234, 244 to implement a smallest amount of delay in the read strobe distribution tree (e.g., the read data strobe signals (RDQST, RDQSC) are delayed a smallest amount). The HBM 130 transmits the data signal (DQ) and first and second data strobe signals (DQST, DQSC) to the MCHB 200 via the I/O 108. The data signal (DQ) transmitted by the HBM 130 is data known by the MCHB 200. In the MCHB 200, data is captured on the data capture path (e.g., by the flip-flops 212, 216) using the read data strobe signals (RDQST, RDQSC). The training circuit 260 (e.g., the checker circuit and the state machine) compares the captured data to the known data and sets the first and second control data in memory 252, 254 as described above with respect to FIG. 2.

At block 606, the first and second control data are written to memory. The first control data is written to the memory 252 by the training circuit 260, and the second control data is written to the memory 254 by the training circuit 260. The first and second control data cause the multiplexers 232, 242 and delay circuits 234, 244 to cause rising edges of the read data strobe signals (RDQST, RDQSC) to be at centers of data eyes.

In static examples, memory is written with the first control data and the second control data. The first control data is written to the memory 252, and the second control data is written to the memory 254. The first and second control data can be based on a usage of the MCHB 200, including a known data rate of data read from the HBM 130.

At block 610, data is captured, by the data capture path, based on the strobe signals from the multiplexers and delay circuits. The HBM 130 transmits the data signal (DQ) and first and second data strobe signals (DQST, DQSC) to the MCHB 200 via the I/O 108. The data capture path captures the data from the read data signal (RDQ), which is based on the data signal (DQ) (e.g., as the result of a comparison by the comparator 210 to a reference voltage). The flip-flop 212 captures even data (DQ_even) based on rising edges of the true read data strobe signal (RDQST), and the flip-flop 216 captures odd data (DQ_odd) based on rising edges of the complementary read data strobe signal (RDQSC). The flip-flop 214 retimes the even data (DQ_even) captured by the flip-flop 212 based on rising edges of the complementary read data strobe signal (RDQSC). The receive FIFO buffer 220 receives data (DQ_even, DQ_odd) from the flip-flops 214, 216 based on rising edges of the complementary read data strobe signal (RDQSC).

To capture the data, the read strobe distribution tree provides the read data strobe signals (RDQST, RDQSC). The read strobe distribution tree includes the multiplexers 232, 242 that output the read data strobe signals (RDQST, RDQSC) based on the first control data written to the memory 252. The multiplexers 232, 242 permit swapping complementary signals (e.g., output by the comparator 230) to be the read data strobe signals (RDQST, RDQSC) based on the first control data. Such swapping can permit rising edges of the read data strobe signals (RDQST, RDQSC) to be moved one UI. The complementary signals output from the multiplexers 232, 242 can be delayed by the delay circuits 234, 244. An amount of delay implemented by the delay circuits 234, 244 is based on the second control data written to the memory 254. The delay circuit 234 outputs the true read data strobe signal (RDQST), which is applied at the RDQST node (e.g., an output node of the driver circuit 236) that is electrically connected to clock input node(s) of the flip-flop(s) 212 (e.g., possibly, to forty-four data capture paths). The delay circuit 244 outputs the complementary read data strobe signal (RDQSC), which is applied at a RDQSC node (e.g., an output node of the driver circuit 246) that is electrically connected to clock input nodes of the flip-flops 212, 216 (e.g., possibly, to forty-four data capture paths) and a clock input node of the receive FIFO buffer 220.

While the foregoing is directed to specific examples, other and further examples may be devised without departing from the basic scope thereof, and the scope thereof is determined by the claims that follow.

What is claimed is:

1. An electronic device comprising:
    a data capture path comprising a first flip-flop and a second flip-flop; and
    a read strobe tree comprising a first comparator, a first multiplexer, and a second multiplexer, wherein:
        the first comparator has a first output node and a second output node, and is configured to output complementary signals on the first output node and the second output node of the first comparator;
        a first selection input node of the first multiplexer is electrically connected to the first output node of the first comparator, and a second selection input node of the first multiplexer is electrically connected to the second output node of the first comparator;
        a first selection input node of the second multiplexer is electrically connected to the second output node of the first comparator, and a second selection input node of the second multiplexer is electrically connected to the first output node of the first comparator;
        the read strobe tree is configured to provide a first signal output from an output node of the first multiplexer to a first node and to provide a second signal output from an output node of the second multiplexer to a second node; and
        a clock input node of the first flip-flop is electrically connected to the first node, and a clock input node of the second flip-flop is electrically connected to the second node.

2. The electronic device of claim 1, wherein the read strobe tree comprises:
    a first delay circuit electrically connected between the output node of the first multiplexer and the first node; and
    a second delay circuit electrically connected between the output node of the second multiplexer and the second node.

3. The electronic device of claim 2, wherein the first delay circuit and the second delay circuit are each configured to have a tunable delay.

4. The electronic device of claim 3, wherein:
    a selection control input node of the first multiplexer is electrically coupled to memory;
    a selection control input node of the second multiplexer is electrically coupled to memory;
    a control input node of the first delay circuit is electrically coupled to memory; and
    a control input node of the second delay circuit is electrically coupled to memory.

5. The electronic device of claim 3 further comprising a training circuit, the training circuit being electrically coupled to a selection control input node of the first multiplexer, a selection control input node of the second multiplexer, a control input node of the first delay circuit, and a control input node of the second delay circuit, the training circuit being configured to set control data for the first multiplexer, the second multiplexer, the first delay circuit, and the second delay circuit based on data captured by the data capture path.

6. The electronic device of claim 1, wherein the data capture path further comprises a second comparator, an output node of the second comparator being electrically coupled to a data input node of the first flip-flop and to a data input node of the second flip-flop.

7. The electronic device of claim 6, wherein the output node of the second comparator is directly electrically connected to the data input node of the first flip-flop and to the data input node of the second flip-flop.

8. The electronic device of claim 1, wherein the data capture path further comprises a third flip-flop, an output node of the first flip-flop being electrically connected to a data input node of the third flip-flop, a clock input node of the third flip-flop being electrically connected to the second node.

9. The electronic device of claim 8 further comprising a buffer, an output node of the third flip-flop being electrically coupled to a first input node of the buffer, an output node of the second flip-flop being electrically coupled to a second input node of the buffer.

10. The electronic device of claim 9, wherein the buffer has a clock input node electrically connected to the second node.

11. A method of operating an electronic device, the method comprising:
    outputting complementary signals on a first output node and a second output node of a first comparator, wherein the first output node is electrically connected to a first selection input node of a first multiplexer and a second selection input node of a second multiplexer, and the second output node is electrically connected to a second selection input node of the first multiplexer and a first selection input node of the second multiplexer;
    outputting a first signal from an output node of the first multiplexer, and a second signal from an output node of the second multiplexer; and
    capturing data, by a data capture path, based on the first signal on a first node and the second signal on a second node, wherein the first node is connected to the output node of the first multiplexer and second node is connected to the output node of the second multiplexer.

12. The method of claim 11, wherein the data capture path comprises a second comparator, a first flip-flop, and a second flip-flop, wherein:
    an output node of the second comparator is electrically coupled to a data input node of the first flip-flop and to a data input node of the second flip-flop;
    a clock input node of the first flip-flop is electrically connected to the first node; and
    a clock input node of the second flip-flop is electrically connected to the second node.

13. The method of claim 12, wherein the output node of the second comparator is directly electrically connected to the data input node of the first flip-flop and to the data input node of the second flip-flop.

14. The method of claim 11 further comprising writing memory with first control data and second control data, wherein:
    a first tunable delay circuit is electrically connected between the output node of the first multiplexer and the first node;
    a second tunable delay circuit is electrically connected between the output node of the second multiplexer and the second node;
    first memory to which the first control data is written is electrically coupled to a control input node of the first multiplexer and a control input node of the second multiplexer; and
    second memory to which the second control data is written is electrically coupled to a control input node of the first tunable delay circuit and a control input node of the second tunable delay circuit.

15. The method of claim 11 further comprising:
    determining first control data and second control data based on data captured by the data capture path;
    setting a configuration of the first multiplexer and the second multiplexer based on the first control data, and a configuration of a first tunable delay circuit and a second tunable delay circuit based on the second control data, wherein:
    the first control data is provided to a control input node of the first multiplexer and a control input node of the second multiplexer;
    the second control data is provided to a control input node of the first tunable delay circuit and a control input node of the second tunable delay circuit;
    the first tunable delay circuit is electrically connected between the output node of the first multiplexer and the first node; and
    the second tunable delay circuit is electrically connected between the output node of the second multiplexer and the second node.

* * * * *